(12) United States Patent
Kledzik

(10) Patent No.: US 7,103,970 B2
(45) Date of Patent: Sep. 12, 2006

(54) METHOD FOR FABRICATING A CIRCUIT BOARD WITH A THREE DIMENSIONAL SURFACE MOUNTED ARRAY OF SEMICONDUCTOR CHIPS

(75) Inventor: Kenneth J. Kledzik, San Clemente, CA (US)

(73) Assignee: Legacy Electronics, Inc., San Clemente, CA (US)

(*) Notice: Subject to any disclaimer, the term of this patent is extended or adjusted under 35 U.S.C. 154(b) by 114 days.

(21) Appl. No.: 10/098,269

(22) Filed: Mar. 14, 2002

(65) Prior Publication Data

US 2002/0162215 A1 Nov. 7, 2002

Related U.S. Application Data

(60) Provisional application No. 60/275,843, filed on Mar. 14, 2001.

(51) Int. Cl.
*H05K 3/30* (2006.01)

(52) U.S. Cl. .............................. 29/832; 29/825; 29/840; 156/250; 438/106

(58) Field of Classification Search ................ 29/825, 29/830, 832, 840, 846; 156/250; 438/106
See application file for complete search history.

(56) References Cited

U.S. PATENT DOCUMENTS

| 3,239,719 A | 3/1966 | Shower |
| 3,665,256 A | 5/1972 | Goun et al. |
| 3,737,986 A | 6/1973 | Cransion |

(Continued)

FOREIGN PATENT DOCUMENTS

| DE | 198 45 316 A1 | 12/1999 |
| DE | 100 29 259 A1 | 12/2001 |
| EP | 0 714 231 A2 | 5/1996 |
| JP | 08-051183 | 2/1996 |
| JP | 09-245926 | 9/1997 |
| JP | 10-074769 | 3/1998 |
| JP | 20031617 | 1/2000 |
| JP | 200031617 | 1/2000 |
| JP | 2003-521806 A | 7/2003 |
| WO | WO 00 65652 | 11/2000 |
| WO | WO 00/68996 | 11/2000 |
| WO | WO 01/48819 A2 | 7/2001 |
| WO | WO 01/69680 A2 | 9/2001 |

OTHER PUBLICATIONS

Notification of Transmittal of the International Search Report or the Declaration PCT/US01/07926.
International Search Report PCT/US01/07926.
"Alterable Interposer Block for Personalizing Stacked Module Interconnections," 30(8) IBM Tech. Discl. Bull. 373–74 (1988).
Notification of Transmital of the International Search Report or the Declaration PCT/US01/07926.

*Primary Examiner*—Carl J. Arbes
(74) *Attorney, Agent, or Firm*—Schwartz Sung & Webster

(57) ABSTRACT

A method and apparatus for fabricating a three dimensional array of semiconductor chips is disclosed. The method uses a multiple step fabrication process that automates the surface mounting of semiconductor chips with unique chip carriers to achieve the three dimensional array of chips. The method includes a step of depositing solder on a multitude of chip carriers at one time, placing the chip carriers with chips on a printed circuit board and then running the board with chips and carriers arranged in a three dimensional array through a single reflow oven to complete a single reflow process to permanently connect all of the components. The apparatus includes a unique chip carrier pallet and print fixture pedestal that work in combination to position the chip carriers for the automatic deposition of solder on a multitude of carriers at once and then position them for addition to the circuit board.

16 Claims, 9 Drawing Sheets

U.S. PATENT DOCUMENTS

| | | | |
|---|---|---|---|
| 3,777,221 A * | 12/1973 | Tatusko et al. | 361/761 |
| 4,038,488 A * | 7/1977 | Lin | 174/52.4 |
| 4,245,877 A | 1/1981 | Auriana | |
| 4,288,841 A * | 9/1981 | Gogal | 361/792 |
| 4,322,778 A * | 3/1982 | Barbour et al. | 361/794 |
| 4,398,235 A | 8/1983 | Lutz et al. | |
| 4,437,235 A | 3/1984 | McIver | |
| 4,549,200 A * | 10/1985 | Ecker et al. | 174/260 |
| 4,616,655 A | 10/1986 | Weinberg et al. | |
| 4,632,293 A | 12/1986 | Feinstein | |
| 4,763,188 A | 8/1988 | Johnson | |
| 4,802,062 A * | 1/1989 | Blum et al. | 361/764 |
| 4,982,265 A | 1/1991 | Watanabe et al. | |
| 5,061,990 A | 10/1991 | Arakawa et al. | |
| 5,107,586 A | 4/1992 | Eichelberger et al. | |
| 5,128,831 A | 7/1992 | Fox, III et al. | |
| 5,130,894 A | 7/1992 | Miller | |
| 5,191,404 A | 3/1993 | Wu et al. | |
| 5,239,198 A | 8/1993 | Lin et al. | |
| 5,239,447 A | 8/1993 | Cotues et al. | |
| 5,241,456 A | 8/1993 | Marcinkiewicz et al. | |
| 5,262,594 A | 11/1993 | Edwin et al. | |
| 5,285,352 A | 2/1994 | Pastore et al. | |
| 5,299,094 A | 3/1994 | Nishino et al. | |
| 5,311,401 A | 5/1994 | Gates, Jr. et al. | |
| 5,311,407 A | 5/1994 | Lumbard | |
| 5,313,366 A | 5/1994 | Gaudenzi et al. | |
| 5,316,787 A | 5/1994 | Frankeny et al. | |
| 5,377,077 A | 12/1994 | Burns | |
| 5,394,300 A | 2/1995 | Yoshimura | |
| 5,400,904 A | 3/1995 | Maston, III et al. | |
| 5,412,538 A | 5/1995 | Kikinis et al. | |
| 5,418,688 A * | 5/1995 | Hertz et al. | 361/790 |
| 5,450,283 A | 9/1995 | Lin et al. | |
| 5,479,318 A | 12/1995 | Burns | |
| 5,492,223 A | 2/1996 | Boardman et al. | |
| 5,498,906 A | 3/1996 | Roane et al. | |
| 5,514,907 A | 5/1996 | Moshayedi | |
| 5,570,274 A | 10/1996 | Saito et al. | |
| 5,579,207 A | 11/1996 | Hayden et al. | |
| 5,656,856 A | 8/1997 | Kweon | |
| 5,677,569 A | 10/1997 | Choi et al. | |
| 5,701,233 A | 12/1997 | Carson et al. | |
| 5,739,581 A | 4/1998 | Chillara et al. | |
| 5,742,097 A | 4/1998 | Matsunaga et al. | |
| 5,744,827 A | 4/1998 | Jeong et al. | |
| 5,744,862 A | 4/1998 | Ishii | |
| 5,754,408 A | 5/1998 | Derouiche | |
| 5,757,079 A | 5/1998 | McAllister et al. | |
| 5,783,870 A | 7/1998 | Mostafazadeh et al. | |
| 5,790,378 A | 8/1998 | Chillara | |
| 5,810,609 A | 9/1998 | Faraci et al. | |
| 5,869,353 A | 2/1999 | Levy et al. | |
| 5,869,356 A | 2/1999 | Fuller, Jr. et al. | |
| 5,910,885 A | 6/1999 | Gulachenski et al. | |
| 5,982,633 A | 11/1999 | Jeansonne | |
| 6,014,316 A | 1/2000 | Eide | |
| 6,028,352 A | 2/2000 | Eide | |
| 6,038,132 A | 3/2000 | Tokunaga et al. | |
| 6,049,972 A | 4/2000 | Link et al. | |
| 6,072,122 A | 6/2000 | Hosoya | |
| 6,081,429 A | 6/2000 | Barrett | |
| 6,084,293 A | 7/2000 | Ohuchi | |
| 6,084,780 A | 7/2000 | Happoya | |
| 6,093,249 A | 7/2000 | Curtin | |
| 6,101,100 A | 8/2000 | Londa | |
| 6,107,683 A | 8/2000 | Castro et al. | |
| RE36,916 E | 10/2000 | Moshayedi | |
| 6,160,718 A | 12/2000 | Vakilian | |
| 6,214,640 B1 * | 4/2001 | Fosberry et al. | 438/106 |
| 6,222,739 B1 | 4/2001 | Bhakta et al. | |
| 6,262,488 B1 | 7/2001 | Masayuki et al. | |
| 6,291,259 B1 | 9/2001 | Chun | |
| 6,313,522 B1 | 11/2001 | Akram et al. | |
| 6,313,524 B1 * | 11/2001 | Pueschner et al. | 257/698 |
| 6,320,757 B1 | 11/2001 | Liu | |
| 6,363,846 B1 | 4/2002 | Murakami | |
| 6,388,335 B1 | 5/2002 | Lam | |
| 6,404,043 B1 | 6/2002 | Isaak | |
| 6,428,650 B1 * | 8/2002 | Chung | 156/250 |
| 6,445,591 B1 | 9/2002 | Kwong | |
| 6,462,284 B1 | 10/2002 | Hashimoto | |
| 6,469,376 B1 | 10/2002 | Vaiyapuri | |
| 6,472,735 B1 | 10/2002 | Isaak | |
| 6,559,539 B1 | 5/2003 | Tu et al. | |
| 6,566,746 B1 | 5/2003 | Isaak et al. | |
| 6,566,760 B1 | 5/2003 | Kawamura et al. | |
| 6,614,110 B1 * | 9/2003 | Pace | 257/737 |
| 6,618,267 B1 * | 9/2003 | Dalal et al. | 361/767 |
| 6,627,984 B1 * | 9/2003 | Bruce et al. | 257/686 |
| 6,628,527 B1 | 9/2003 | Muramatsu et al. | |
| 6,665,194 B1 | 12/2003 | Patel et al. | |
| 6,683,377 B1 | 1/2004 | Shim et al. | |
| 6,777,798 B1 | 8/2004 | Fukumoto et al. | |
| 6,828,666 B1 | 12/2004 | Herrell et al. | |
| 6,924,556 B1 | 8/2005 | Cha | |
| 2002/0088355 A1 | 7/2002 | Comulatda, Jr. et al. | |
| 2003/0122240 A1 | 7/2003 | Lin et al. | |
| 2003/0137808 A1 | 7/2003 | Kledzik et al. | |
| 2003/0168725 A1 | 9/2003 | Warner et al. | |
| 2003/0201526 A1 | 10/2003 | Bolken et al. | |

* cited by examiner

METHOD FOR FABRICATING A CIRCUIT BOARD WITH A THREE DIMENSIONAL SURFACE MOUNTED ARRAY OF SEMICONDUCTOR CHIPS

RELATED APPLICATIONS

The present application claims priority under 35 USC §119(e) from U.S. provisional application Ser. No. 60/275,843, filed Mar. 14, 2001 and entitled "A Method and Apparatus for Fabricating a Circuit Board with a Three Dimensional Surface Mounted Array of Semiconductor Chips".

FIELD OF THE INVENTION

The present invention relates to a semiconductor manufacturing process and more particularly to a method and system for fabricating semiconductor chips in a three-dimensional array on a printed circuit board.

BACKGROUND OF THE INVENTION

Semiconductor chips are typically connected to a printed circuit board that in turn interconnects the chip into the rest of circuitry with which the chip will operate including other chips on the printed circuit board. In the past the chips were spread out across the printed circuit board on their large flat sides in a simple two-dimensional array. Over the years the trend in the computer industry has been towards more densely packed printed circuit boards. Among the causes for this are the increasing demand for larger random access computer memories, demand for faster computers, demand for more compact computers and a push to decrease costs of printed circuit boards by increasing the circuit density on the printed circuit board. In the mid to late 1980's the industry switched over from a technology that attached computer chips to a printed circuit board through holes in the printed circuit board to one that used a surface mounting technology. With the advent of surface mount technology, conventional through-holes on printed circuit boards have been replaced with conductive mounting pads on the surface of the printed circuit board. This allows for multiple layered circuit boards with a complex network of interconnect lines running between the layers of the board. In turn this has allowed for the increase in the density of chips on a printed circuit board which not only decreases the size of the board but increases the operating speed of the computer by reducing the distance signals have to travel between chips on the board.

The move to surface mount technology has consequently resulted in the practice of positioning the chips on the printed circuit board in a variety of configurations to increase chip density on the circuit board and thereby decrease the distance between the chips to speed up operation of the to overall system. Generally, conventional configurations stack the chips on one another to increase density. The practice of stacking the chips on one another is particularly adaptable to memory chips given the redundancies in their circuits. Up until the present, in order for the chips to be stacked on one another to increase chip density and achieve a three-dimensional array on the circuit board, computer makers had to send the chips to a third party manufacturer that specialized in the technique of permanently bonding chips in a stacked fashion. Stacking the chips generally consisted of soldering them together. This in turn created a variety of problems including time delays inherent in having to rely on an outside manufacturing facility and potential damage to the chip as a result of directly soldering the chips together.

Recent developments, in particular those of the applicant of the present invention have resulted in new and much more efficient means for stacking chips on a printed circuit board in a three dimensional array. These developments are described in detail in copending patent applications owned by the applicant herein, they being: United States patent application for a "Circuit Board Assembly Having A Three Dimensional Array of Integrated Circuit Packages" Ser. No. 09/285,354 filed Apr. 4, 1999, and United States patent application for a "Electronic Module Having a Three Dimensional Array of Carrier-Mounted Integrated Circuit Packages" Ser. No. 09/524,324 filed Mar. 3, 2000. Both of these applications are incorporated herein by reference and made part hereof as if set forth herein at length. The two referenced applications describe a unique electronic module that in effect provides a platform that is placed over a chip on a circuit board and connects to contact pads on the circuit board that the platform shares with the chip underneath it. The second chip is then connected to the top of the platform to achieve a stacked three-dimensional array as more fully described in the above referenced patent applications. 21A and 21B of FIG. 1 depict two different variations of the chip carriers described and claimed in the two above referenced applications. 21A depicts a chip carrier made in the form of a printed circuit board and 21B depicts a chip carrier made in a molded packaging.

However, in order to maximize the advantages of the electronic chip carrying modules described in the two above mentioned copending applications what is needed is a manufacturing process and apparatus which will automate and optimize their installation. Additionally, it should be a manufacturing process and apparatus that can be used in house by a computer or circuit board manufacturer without the need to use the services of a third party manufacturer.

SUMMARY

It is an object of the present invention to provide an efficient and cost effective manufacturing process and apparatus that utilize new developments that allow the placing chips in a three dimensional array on a printed circuit board. It is a further object of the present invention to provide an apparatus and method that can be utilized with current methods and semiconductor manufacturing machines used in the assembly of printed circuit boards.

These and other objects are achieved by providing a method for populating a circuit board with a three dimensional array of semiconductor chips with the following steps: a) verifying electrical contacts on a plurality of chip carriers are properly aligned for an assembly process; b) preparing a chip receiving side of said chip carriers to receive a chip and passive components; c) preparing a circuit board for a chip assembly process; d) populating said circuit board with a first layer of chips and passive components said chips and passive components being positioned to make contact with preselected predetermined electrical contact points; e) positioning said chip carriers over said first layer of chips so that said chip carriers make contact with preselected electrical contact points on said circuit board; f) placing on each of said chip carriers a semiconductor chip with passive components; and g) interconnecting in a permanent fashion said chips, passive components and chip carriers to said circuit board.

In another aspect of the invention it provides a system for populating a circuit board with a three dimensional array of semiconductor chips comprising: a) a plurality of chip carriers attachable to a circuit board with space for a chip to be positioned directly on the circuit board beneath of each chip carrier as well as for positioning a chip on top of the chip carrier to thereby create a three dimensional array of chips on the circuit board; b) a pallet for holding and moving a plurality of chip carriers during a circuit board assembly process, the pallet having a matrix of chambers in a frame like form with the chambers being open at least at a top side of the pallet each chamber being formed to hold a chip carrier during the circuit board assembly process, the chip carriers being positioned in each of the chambers of the pallet with a top, chip receiving side, of the chip carrier facing out from the top of the pallet to thereby make the top side of the chip carrier accessible during the circuit board assembly process; and c) a mechanism to move and position the pallet during the assembly process so that the plurality of chip carriers held by the pallet can be prepared to receive a chip during the assembly process and easily accessed, removed from the pallet and positioned on the circuit board over chips positioned directly on the circuit board with chips positioned on each chip carrier to thereby create a three dimensional array of chips on the circuit board.

In still another aspect of the invention it provides an apparatus for positioning and securely but detachably holding a chip module during a semiconductor fabrication process comprising: a) a pallet for holding chip modules the pallet having a two dimensional matrix of chambers, the chambers being open at a first and second opposing parallel sides of the pallet, the chambers having at a base adjacent to the opening on the second side of the pallet a flange around the inside of the chamber to allow the chamber to retain a chip module of approximately the same dimensions as the chamber when the first side of the pallet faces up; b) a print fixture pedestal with a two dimensional matrix of raised portions that match the matrix of the chambers of the pallet such that the raised portions are sized such that the raised portions fit on a one for one basis into the chambers of the pallet from the second side of the pallet; and c) wherein when the chambers are filled with chip modules and a the print fixture pedestal is joined with the pallet at the pallets second side the raised portions elevate chip modules located in the chambers to a work position from which they can be worked on from the first side of the pallet.

BRIEF DESCRIPTION OF THE DRAWINGS

The invention will be better understood by an examination of the following description, together with the accompanying drawings, in which.

DETAILED DESCRIPTION OF THE PREFERRED EMBODIMENT

Figure 1:
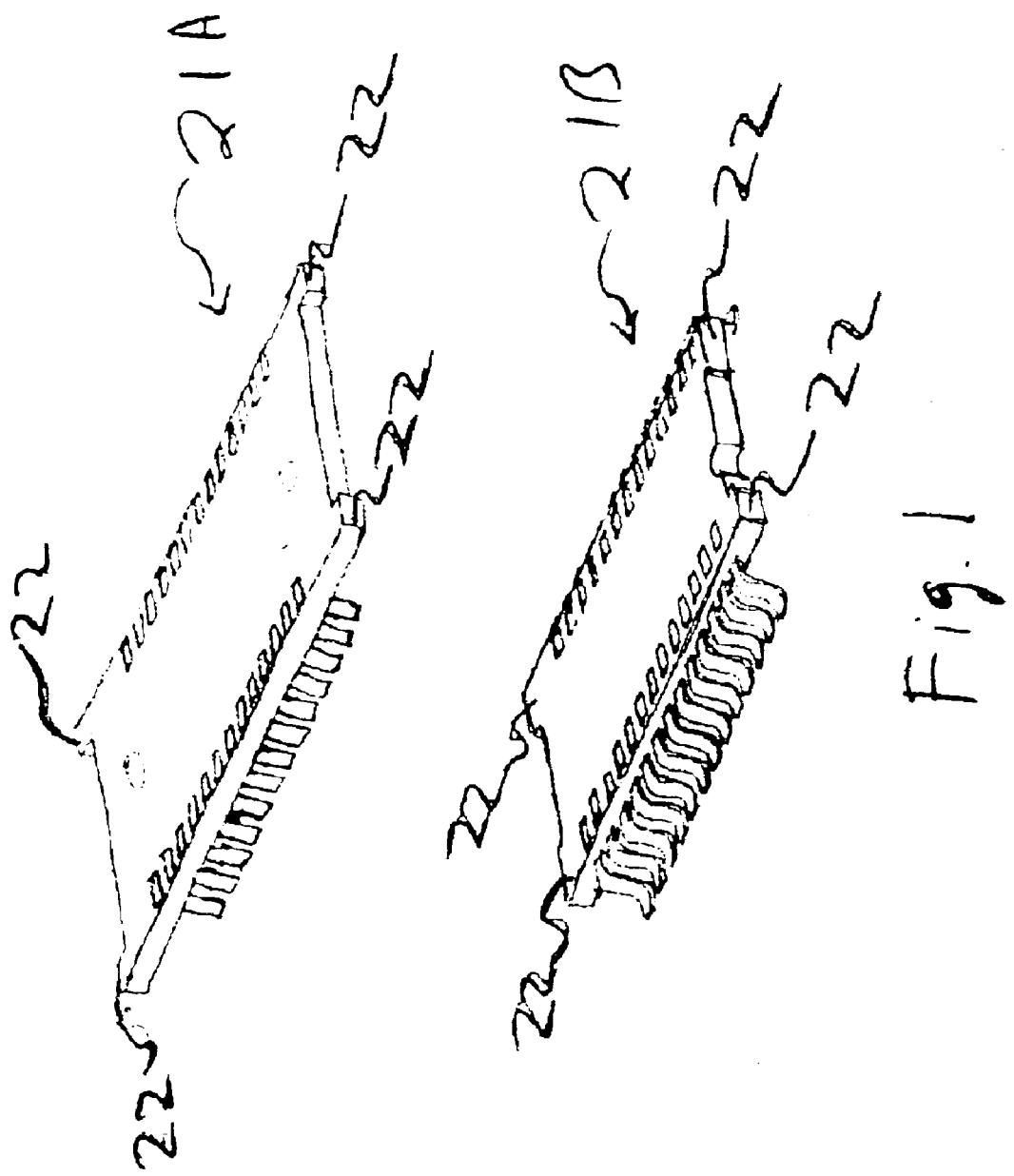
FIG. 1 depicts two different versions of the electronic chip carrying modules.

The method of the preferred embodiment of the present invention uses a three step fabrication process that automates the surface mounting on a printed circuit board of the chip carriers similar to those depicted as 21A and 21B in FIG. 1 and as described in the above two copending applications referenced above that have already been incorporated herein by reference. The first step involves the stenciling (the depositing of solder paste) on a large number of chip carriers 21 at one time. The second step involves moving the chip carriers to an assembly stage where they are placed on the circuit board over the chips and passive devices that have been placed directly onto the circuit board. Chips together with appropriate passive devices are then placed on the chip carriers. In the third and final stage the circuit board with components attached is passed through a single reflow process to complete permanent interconnection with solder of the various components on the board and chip carriers.

Figure 2:
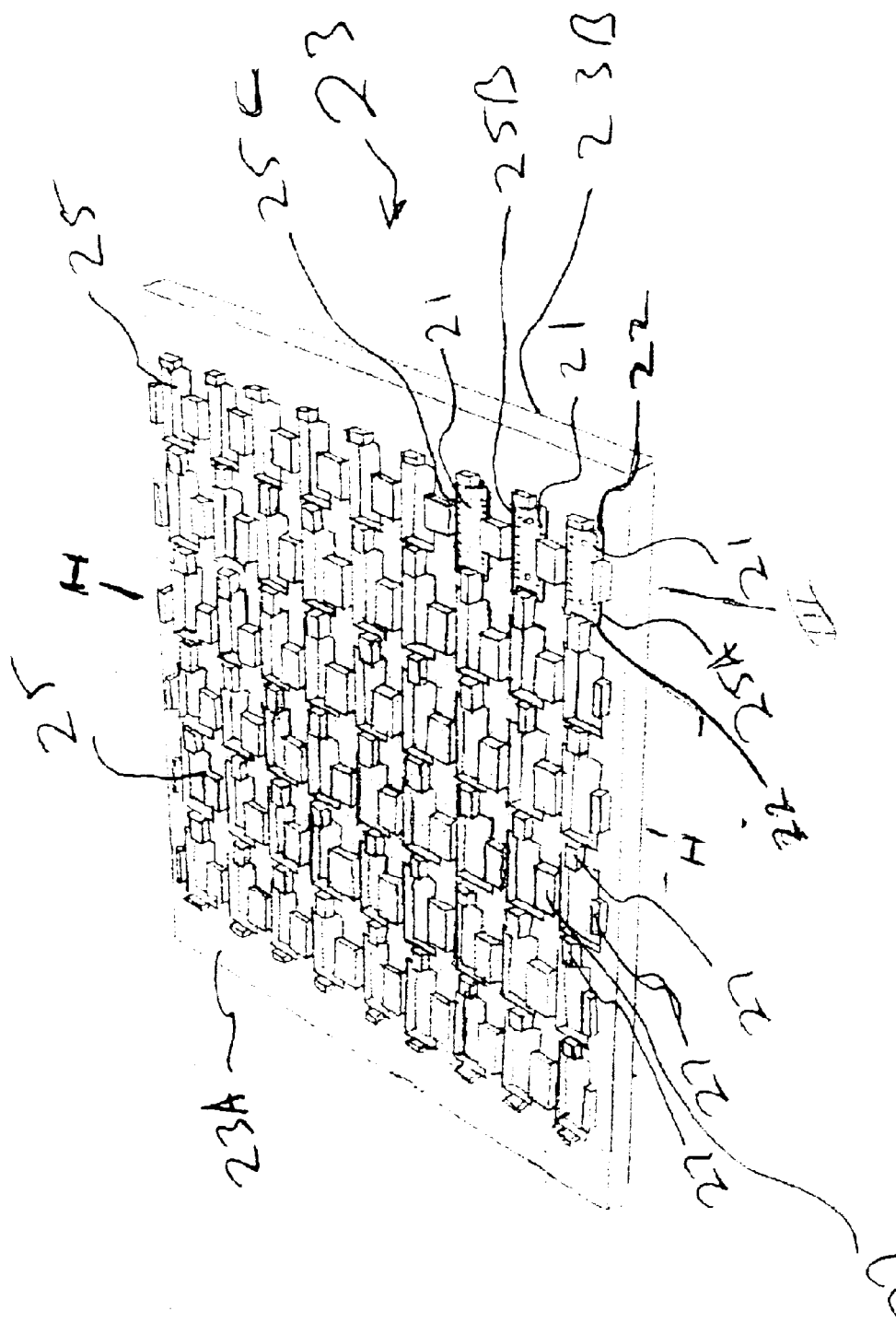
FIG. 2 is a raised perspective view of the pallet that holds the electronic chip carrying modules during the manufacturing process of the present invention.

The preferred embodiment of the present invention uses two new devices to aid in the movement and stenciling of a large number of chip carriers at one time. During the fabrication process the chip carriers 21 are held by a chip carrier pallet 23 as depicted in FIG. 2. The preferred embodiment of pallet 23 as depicted has a total of fifty-four chambers 25 each one of which holds a chip carrier 21. In FIG. 2 only chambers 25A, 25B and 25C have chip carriers 21. Each of the chambers 25 in pallet 23 are open at the top 23A and bottom 23B of the pallet. The size of each of the chip carriers are approximately the same size as each chamber 25 in pallet 23 with the exception of four corner projections or flanges 22 on chip carriers 21. Each chip carrier is thus sized such that when a chip carrier is positioned in a chamber 25 the flanges 22 project beyond the chamber and rest on the top surface 23A of the pallet as demonstrated by 25A, 25B and 25C in FIG. 2. Thus, each chip is prevented from falling through chamber 25 when placed in the chamber.

Figure 2A:
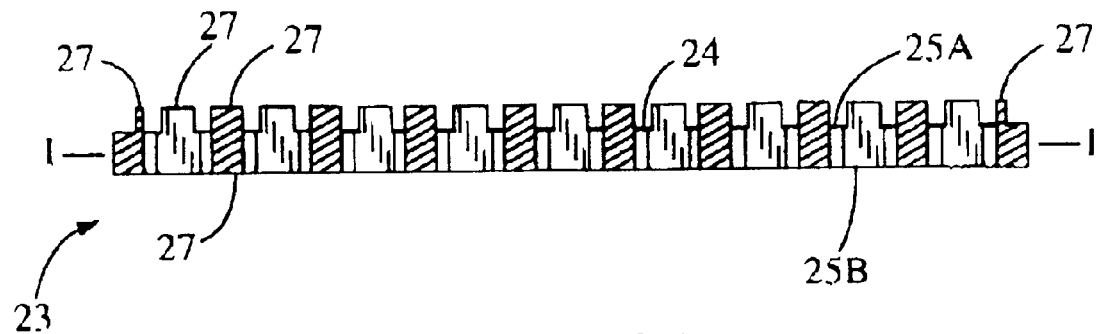
FIG. 2A is a cross sectional view of the pallet depicted in FIG. 2 along line I—I.

Each chamber 25 in the preferred embodiment has four abutments 27 around the top outside edge as depicted in FIG. 2. The abutments 27 are designed to hold the chip carriers 21 and protect the chip carriers when positioned in a chamber 27. The abutments 27 provide protection because a chip carrier 21 when positioned in a chamber 25 is located in a recessed position below the top of the surrounding abutments 27. The pallet 23 can be made of a variety of materials including durable plastic, aluminum or any other suitable material. FIG. 2A is a cross sectional view of the pallet along line I—I that clearly shows the open tops 23A and bottoms 23B of chambers 25. The abutments 27 protect the top of each chip carrier 21 during the fabrication process while the chip carriers are in the chambers 25 of pallet 23. The tops of the chip carriers 21 are protected so that after solder paste is deposited on top of the carrier, as will be described below the pallets can be stacked and moved about without disturbing the solder paste on top of the chip carriers.

Figure 3:
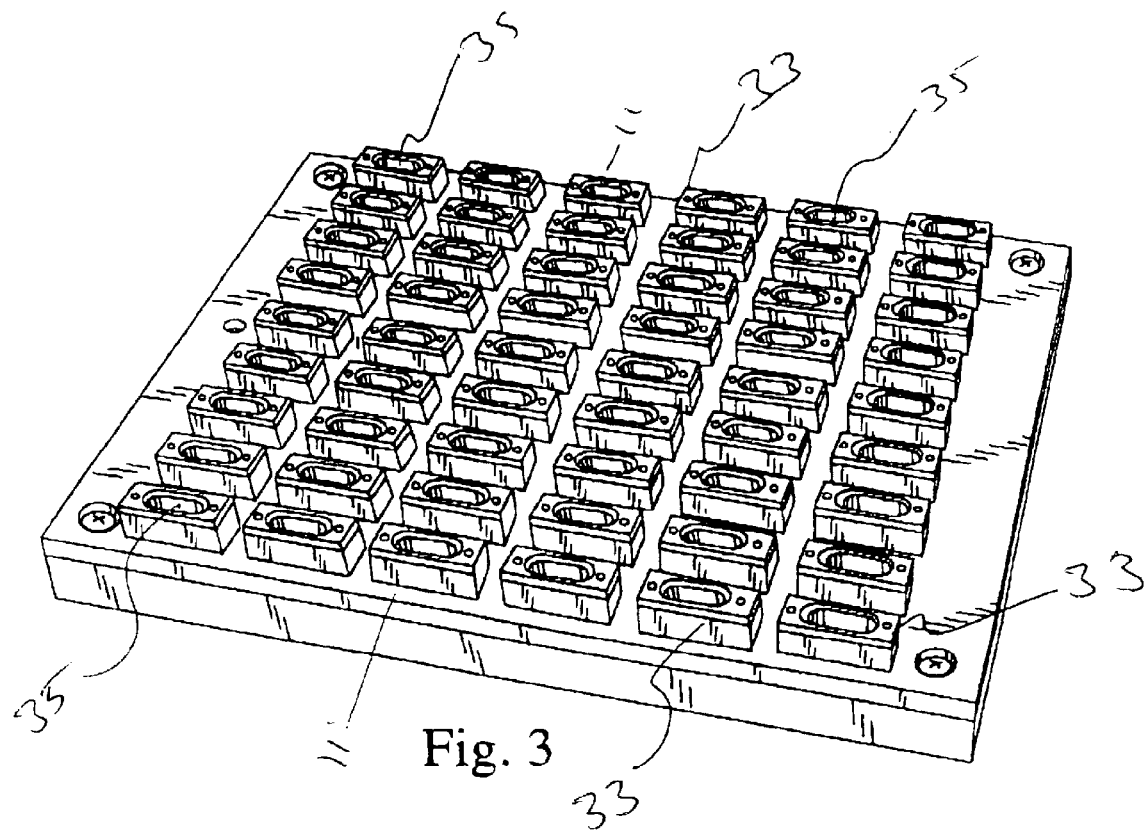
FIG. 3 is a raised perspective view of a print fixture pedestal of the present invention used in the stenciling step of the chip carrying modules.
Figure 3A:
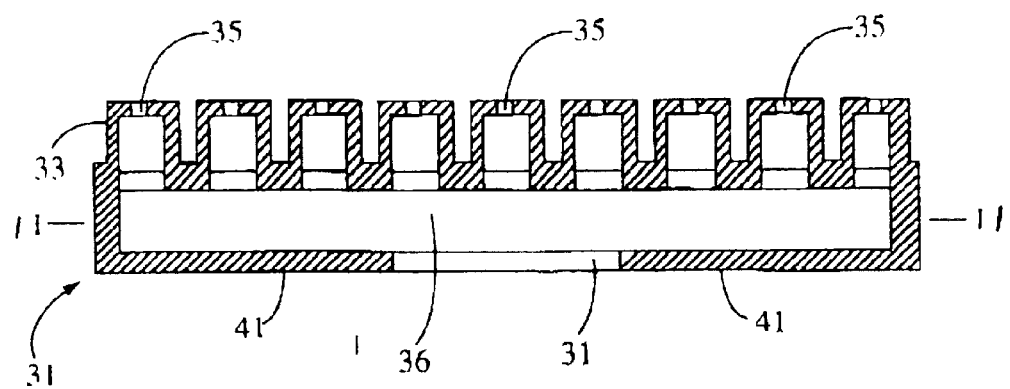
FIG. 3A is a cross sectional view of the print fixture pedestal depicted in FIG. 3 along line II—II.
Figure 4:
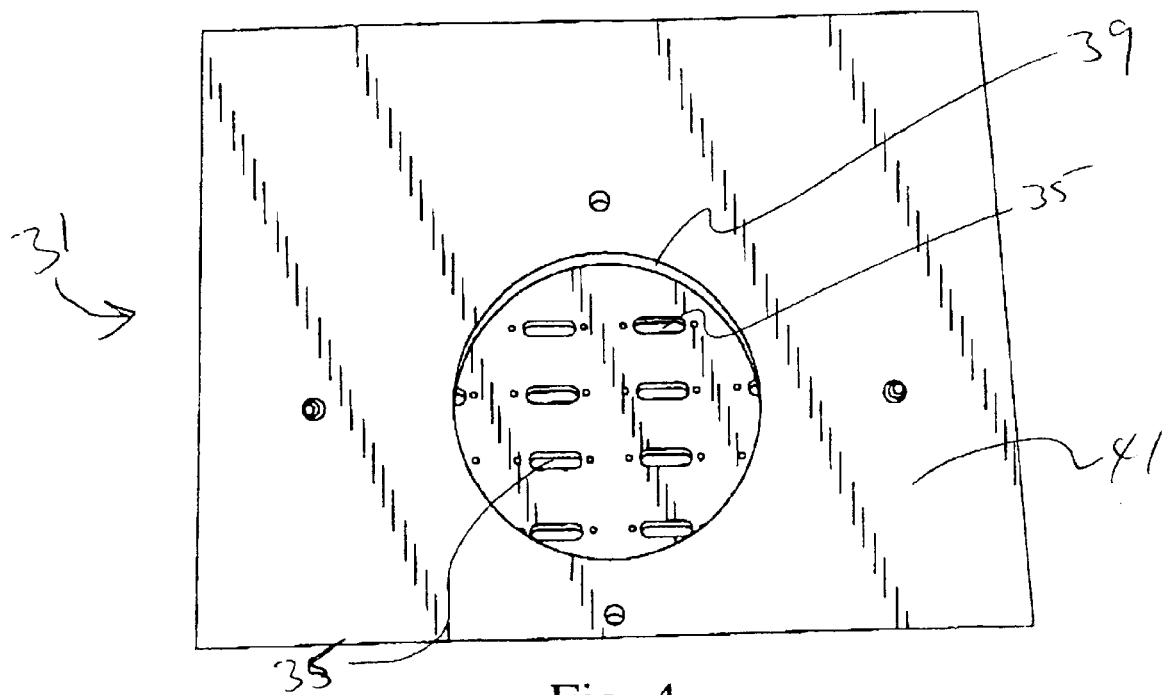
FIG. 4 is a view of the bottom the print fixture pedestal of the present invention.

The second new device is the print fixture pedestal 31 shown in a raised perspective view in FIG. 3. The print fixture pedestal 31 has series of raised block like areas 33. The block like areas 33 are in a nine by six matrix that matches the nine by six matrix of chambers 25 of pallet 23. The matrix of raised areas 33 are designed and sized to fit into the bottom of the corresponding chamber 25 in the pallet 23. Print fixture pedestal 31 is hollow inside and each raised block area 33 has a top opening 35 that opens into the hollow interior of print fixture pedestal 31. FIG. 4 provides a bottom view of the print fixture pedestal 31. Some of the top openings 35 can be seen through circular opening 39 of the bottom plate 41 of the print fixture pedestal 31. FIG. 3A is a cross sectional view of print fixture pedestal 31 along line II—II of FIG. 3. The hollow interior 36 can be seen in FIG. 3A. The bottom plate 41 secures to a movable hollow shaft, not shown. The hollow portion of the shaft opens into the hollow interior 36 of print fixture pedestal 31. Print fixture pedestal 31 can be made of cast aluminum or any other of a number of suitable materials.

Figure 6A:
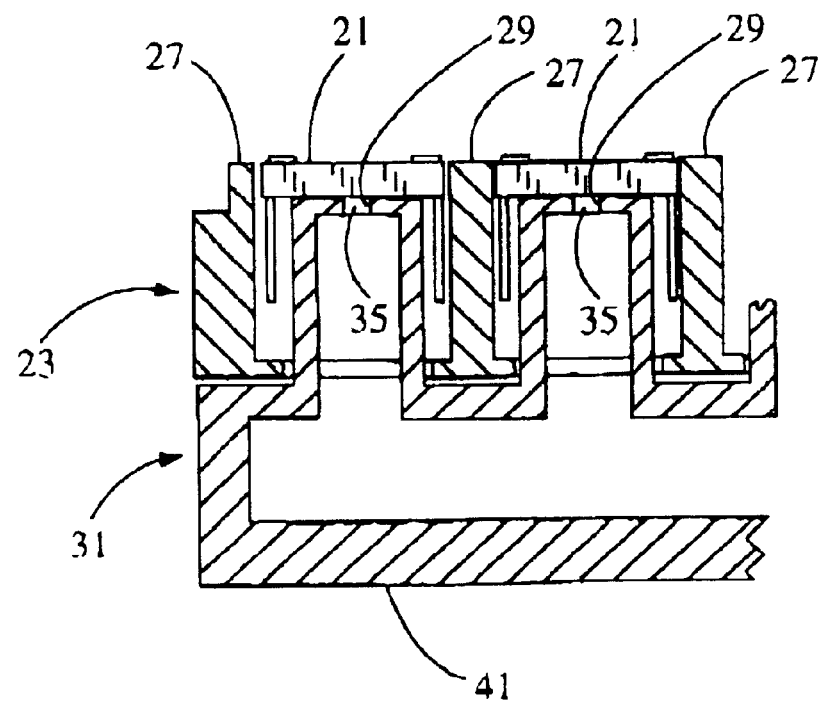
FIG. 6A is a cross sectional view from FIG. 6 at III of one chamber of the pallet with a raised portion inserted therein supporting a chip carrier.

Print fixture pedestal 31 is designed to fit like a glove into the bottom of pallet 23 and raise and secure the chip carriers 21 in the chambers 25 of pallet 23. When print fixture pedestal 31 is joined with pallet 23 (FIG. 6), top openings 35 are flush against the bottoms of the chip carriers located in chambers 25 and a sealed space 36 is created in print fixture pedestal 31 to create a slight vacuum to hold chip carriers 21 during the stenciling process as will be explained in more detail below. FIG. 6A is a cross section along line III of FIG. 6 of one chamber 25 with a raised portion 33 inserted therein supporting a chip carrier 21. As can be seen raised area 33 positioned in a chamber 25 has its top opening 35 flush against the bottom 29 of a chip carrier 21.

Figure 5:
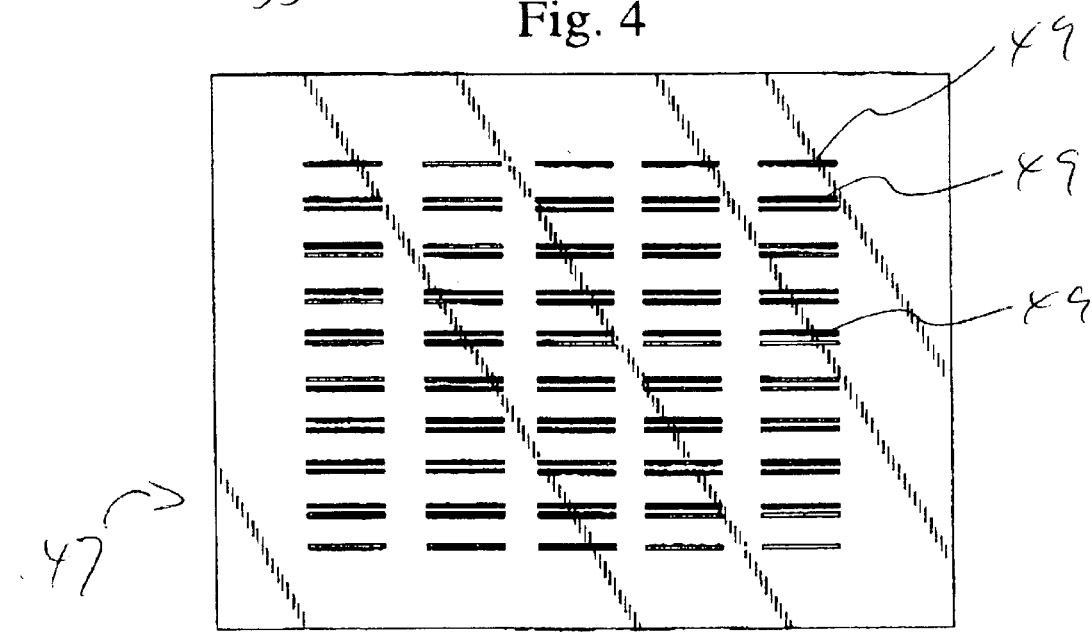
FIG. 5 is top view of a stencil used in the manufacturing process of the present invention.

FIG. 5 provides a top view of a stencil 47 used in the stenciling process. Stencil 47 is a template used to deposit solder on the connector pads 46 (FIGS. 1 and 2) of the chip carriers 21 when they are positioned in the chambers 25 of pallet 23 and chip carriers 21 are securely held by the print fixture pedestal 31. As will be shown below, stencil 47 is placed over the pallet 23 when it is filled with chip carriers 21 and the matrix of rows of holes 49 on stencil 47 match up with the contact pads 46 on top of the chip carriers in each of the chambers 25 of the pallet 23. Stencil 47 is usually a made of a sheet of stainless steel or some other similarly suitable material.

Figure 6:
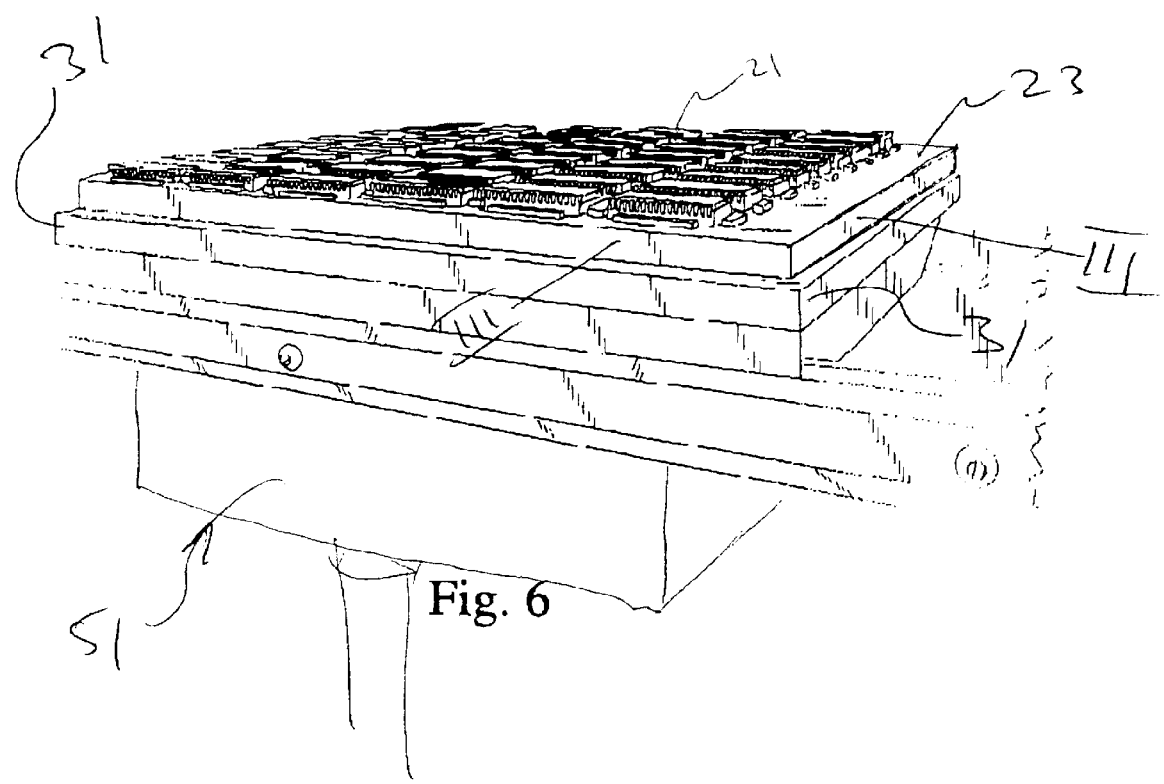
FIG. 6 is a side view of the pallet and print fixture pedestal joined together for one of the stages of the manufacturing process of the present invention.
Figure 7:
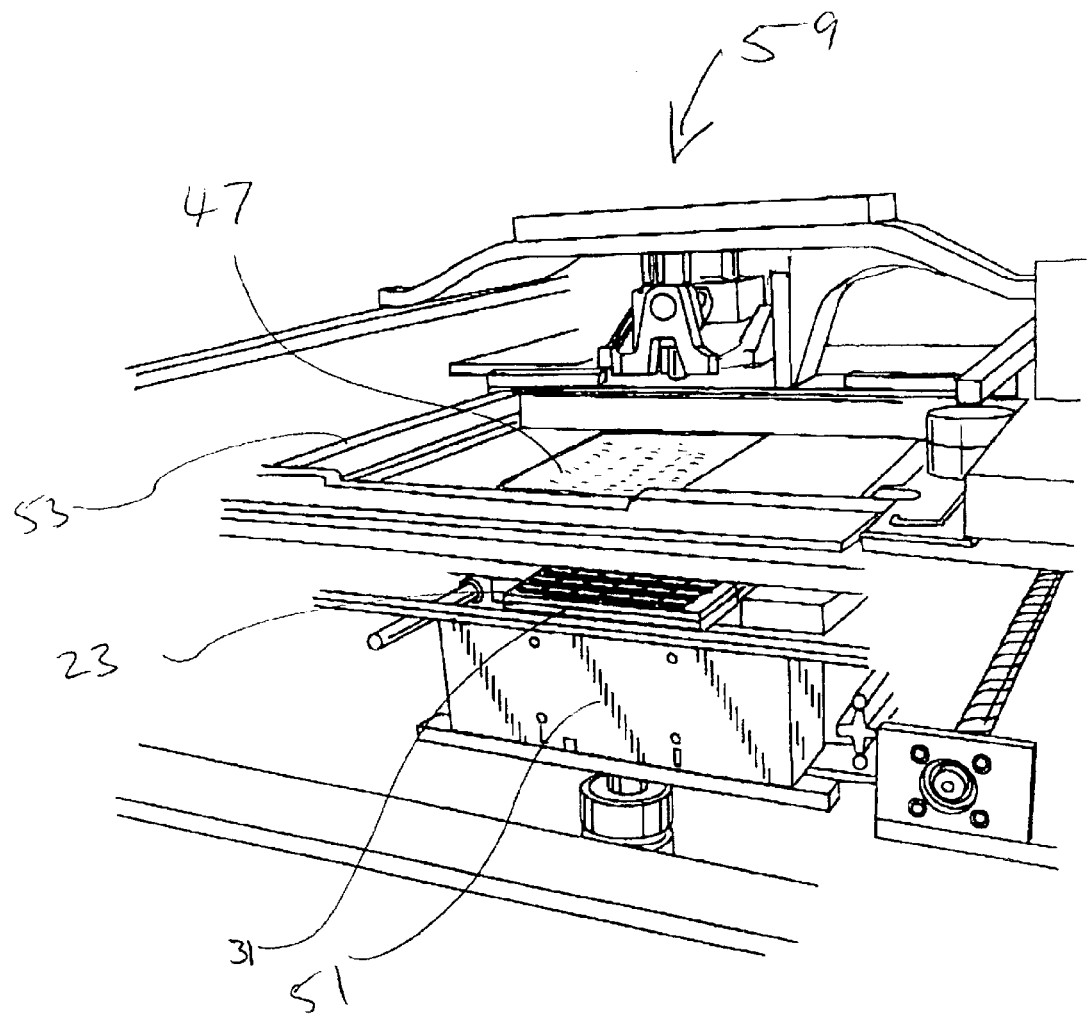
FIG. 7 is a view of the stenciling step of the present invention.

The preferred embodiment of the present invention uses an automated stencil printer for the stenciling process. As depicted in FIG. 6 pallet 23 filed with chip carriers 21 with print fixture pedestal 31 positioned underneath it is positioned on the work nest 51. Also, as noted above when print fixture pedestal is joined to pallet 23 this raises chip carriers 21 partially out of the top of chambers 25 of pallet 23. Referring next to FIG. 7 work nest 51 with the joined print fixture pedestal 31 and pallet 23 are positioned below the stencil 47. Stencil 47 is positioned by an appropriate positioning apparatus with the aid of a special bi-directional camera not shown that is inserted between the stencil 47 and pallet 23 in a process well known in the art. The camera lines up the stencil and pallet by keying off of fiducials located on the stencil 47 and pallet 23. Once the machine assures correct alignment, print fixture pedestal 31 and pallet 23 are raised by work nest 51 towards stencil 47 until the tops of the chip carriers 21, positioned in pallet 23, abut up against stencil 27. Work nest 51 has pneumatic means to raise and lower the enter structure. At this point solder deposition mechanism 59 is lowered onto the top of stencil 47 and the solder is deposited through the array of matrix holes 49 of the stencil. Matrix holes 49 expose the contact pads 46 of chip carriers 21 so that mechanism 59 can precisely deposit the solder on the contact pads. Once completed, mechanism 59 is raised from stencil 47 and stencil 47 is retracted upward. Since the chip carriers are being securely held by the vacuum created between raised area 33 of print fixture pedestal 31 and the bottom of each of chip carriers 21 (see FIG. 6A) none of the chip carriers 21 will inadvertently stick to the stencil 47 pallet 23 is retracted or lowered.

Figure 8:
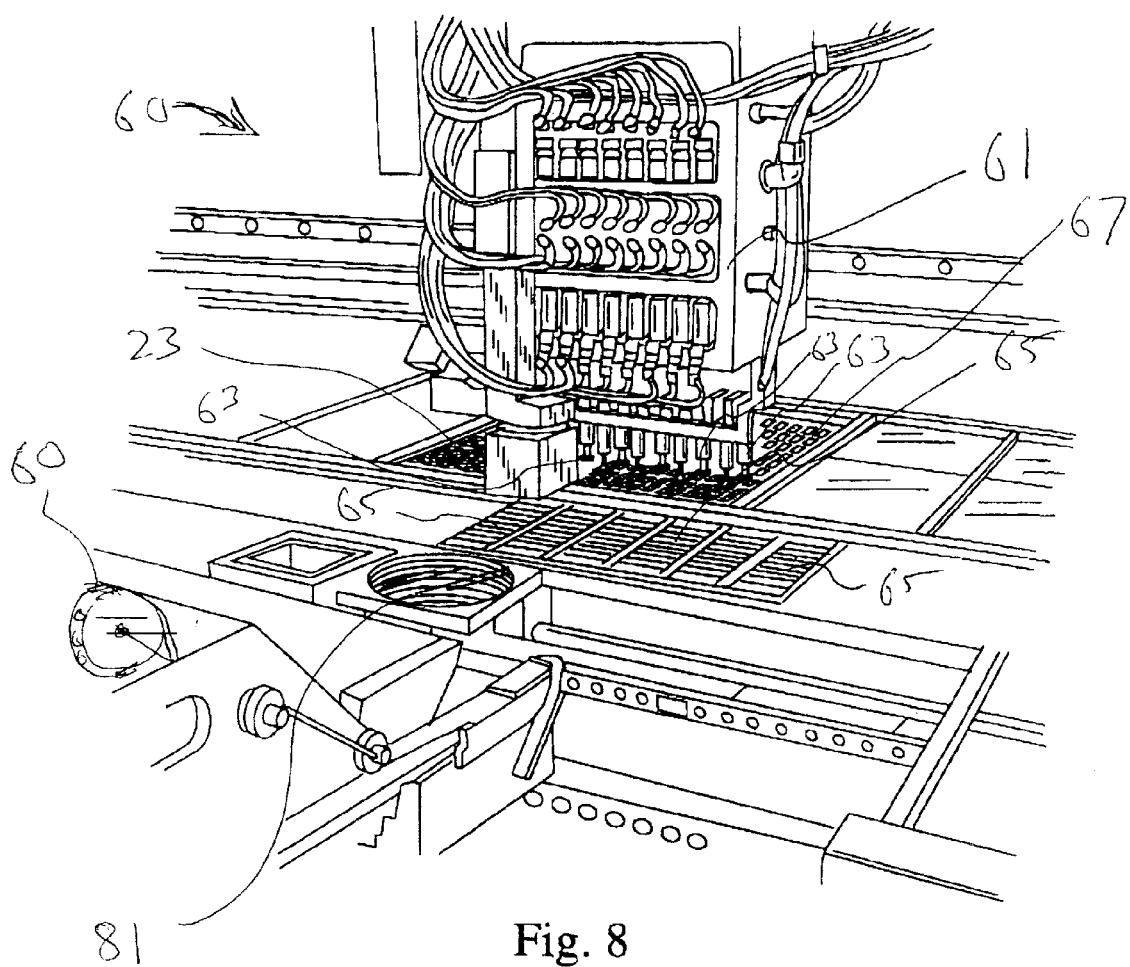
FIG. 8 is a view of the circuit board assembly step of the present invention.
Figure 9:
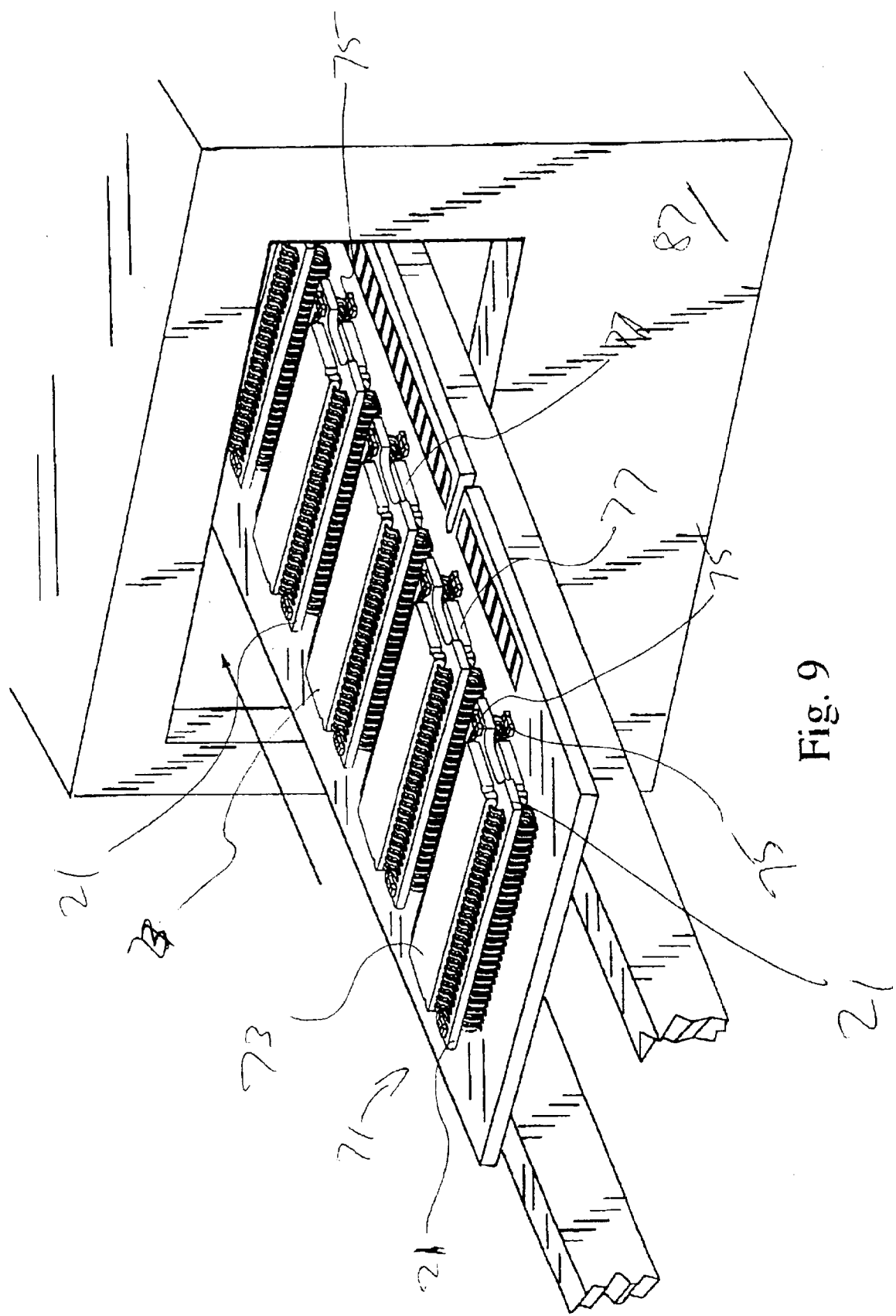
FIG. 9 is a side view of an oven used in the single reflow process of the present invention.

Once the stenciling process has been completed pallet 23 is disengaged from print fixture pedestal 31 and the pallet 23 with stenciled chip carriers 21 is moved onto the next stage, the circuit board assembly process as depicted in FIG. 8. In the preferred embodiment of the circuit board assembly process a standard Pick and Place machine 60 is used. During the assembly process a gantry 61 with various pick and place nozzles 63 first places semiconductor computer chips 73 onto circuit board 65 together with various passive devices. The chips in FIG. 8 are being taken from tray 67 or alternatively a tape in a manner standard to the industry. Also, passive devices, i.e. resistors, capacitors, etc. are coming from rolls 69 in a manner standard to the industry. Once circuit board 65 is populated with the first layer of chips and passive devices gantry 61 then begins placement of the chip carriers 21 that it takes from pallet 23. Upon completion of placement of all of the chip carriers 21 on circuit board 65 it begins placing the chips on the chip carriers 21 together with appropriate passive devices. FIG. 9 depicts a portion of a completed circuit board 65 with first layer of chips 73, passive devices 75, chip carrier 21 and second layer of chips 77 and passive devices 79 on the chip carriers 21. During the placement process each chip, chip carrier and passive device placed on circuit board 65 is momentarily present to camera 81 (FIG. 8) for inspection. Any of these devices that appear on their surface to be defective are then discarded.

The third and final step is a single reflow process during which the circuit board 65 with components attached is passed through an oven 87 to permanently attach the components to the board by melting the solder previously placed on the board and chip carriers. FIG. 9 depicts board 65 entering oven 87. Use of a single reflow process avoids unduly stressing the circuit board and components attached to it since circuit board 65 has all of the components placed on it before going through oven 87. In the preferred embodiment a standard reflow oven is used. As is well known in the art the single reflow oven causes the solder paste to melt and thus fuse the various components placed on the board to the board including the chip carriers. Naturally, the components placed on each chip carrier to fuse to that chip carrier at the same time. One of the advantages of the present invention is that it allows all of the components, chips, chip carriers and passive components to be positioned in one step on the printed circuit board. Once in place the board is sent through an oven to melt the solder paste holding the components on the board and permanently to the board. This avoids the need to put the board through an oven a multiple number of times. However, those skilled in the art once they have reviewed this specification and understand the concepts of this invention will be able to adapt any number of commercially available fabrication machines for the stenciling, assembly or single reflow process.

While the invention has been particularly shown and described with reference to a preferred embodiment thereof, it will be understood by those skilled in the art that various changes in form and detail may be made to it without departing from the spirit and scope of the invention.

What is claimed is:

1. A method for populating a circuit board with a three dimensional array of semiconductor chips comprising the steps of:
   a) preparing a chip receiving side of a plurality of chip carriers to receive chips and passive components in an automated process comprising a prepasting step;
   b) positioning said chip carriers over a first layer of chips positioned on said board so that said chip carriers make contact with preselected electrical contact points on said circuit board;
   c) placing on each of said chip carriers a semiconductor chip with one or more passive components, wherein said semiconductor chip and said one or more passive components are electrically interconnected, and said one or more passive components are selected from the group consisting of resistors and capacitors; and
   d) interconnecting in a permanent fashion said chips, passive components and chip carriers to said circuit board.

2. The method of claim 1 further comprising the steps of:
   a) verifying electrical contacts on a plurality of chip carriers are properly aligned for an assembly process;
   b) preparing a circuit board for a chip assembly process; and
   c) populating said circuit board with a first layer of chips and passive components said chips and passive components being positioned to make contact with preselected predetermined electrical contact points.

3. A method for populating a circuit board with three dimensional array of semiconductor chips comprising the steps of:
   a) preparing a chip recieving side of a plurality of chip carriers to recieve chips and passive components;
   b) positioning said chip carriers over a first layer of chips positioned on said board so that said chip carriers make contact with preselected electrical contact points on said circuit board;
   c) placing on each of said chip carriers a semiconductor chip with one or more passive components;
   d) interconnecting in in permanent fashion said chips, passive components and chip carries to said circuit board; and
   e) holding said plurality of chip carriers in a chip carrier pallet wherein said chip carriers are positioned in a flat matrix array with the chip receiving side of each of said plurality of chip carriers are exposed at a top of said pallet so that during said stenciling step said chip carrying side of each chip can be accessed and so that during said positioning step each chip can be retrieved during said positioning step.

4. The method of claim 3 wherein said step of holding said chip carriers in a chip carrier pallet includes providing a matrix of chambers open at the top side and bottom side of said pallet, said pallet having a protective barrier that protects the chip carrier in a recessed position when the chip carriers are positioned in a chambers.

5. The method of claim 4 including the step of securing and positioning said chip carriers during said stenciling process with a print fixture pedestal having a matrix like array of protusions, each protrusion being positioned and sized to fit into the bottom of a chamber in said pallet and engage securely but detachably the bottom side of a chip carrier in said chamber and thereby lift said chip carrier above said protective barrier during said stenciling process, assure said chip carrier will disengage from said stenciling process when completed and return said chip carriers to said recessed position.

6. The method of claim 5 wherein said step of securing said chip carrier comprises said protrusion securing said bottom side of said chip carrier by a vacuum created by an aperture at the top of said protrusion surface which abuts against the bottom side of said chip carrier.

7. The method of claim 1 including the additional step of holding said plurality of chip carriers in a chip carrier pallet wherein said chip carriers are positioned in a flat matrix array with the chip recieving side of each of said plurality of chip carriers are exposed at a top of said pallet so that during said stenciling step said said chip carrying side of each chip can be accessed and so that during said positioning step each chip can be retrieved during said positioning step.

8. The method of claim 7 wherein said step of holding said chip carriers in a chip carrier pallet includes providing a matrix of chambers open at the top side and bottom side of said pallet, said pallet having a protective barrier that protects the chip carrier in a recessed position when the chip carriers are positioned in a chambers.

9. The method of claim 8 including the step of securing and positioning said chip carriers during said stenciling process with a print fixture pedestal having a matrix like array of protusions, each protrusion being positioned and sized to fit into the bottom of a chamber in said pallet and engage securely but detachably the bottom side of a chip carrier in said chamber and thereby lift said chip carrier above said protective barrier during said stenciling process, assure said chip carrier will disengage from said stenciling process when completed and return said chip carriers to said recessed position.

10. The method of claim 9 wherein said step of securing said chip carrier comprises said protusion securing said bottom side of said chip carrier by a vacuum created by an aperture at the top of said protusion surface which abuts against the bottom side of said chip carrier.

11. The method of claim 1 wherein said preparing step comprises depostiing solder paste.

12. A method for populating a circuit board with a three dimensional array of semiconductor chips comprising the steps of:
   a) preparing a chip recieving side of a plurality of chip carriers to recieve chips and passive components without soldering said chips and passive components;
   b) positioning said chip carriers over a first layer of chips positioned on said board so that said chip carriers make contact with preselected electrical contact points on said circuit board without soldering said chip carriers;
   c) placing on each of said chip carriers a semiconductor chip with one or more passive components without soldering said chip and passive components creating a three dimensional arrangement on said circuit board; and
   d) soldering, in one step, said chips and passive components to said chip carriers, and said chip carriers to said circuit board when all are configured in a three dimensional array.

13. The method of claim 12 including the additional step of holding said plurality of chip carriers in a chip carrier pallet wherein said chip carriers are positioned in a flat matrix array with the chip receiving side of each of said plurality of chip carriers are exposed at a top of said pallet so that during said stenciling step said chip carrying side of each chip can be accessed and so that during said positioning step each chip can be retrieved during said positioning step.

14. The method of claim 13 wherein said step of holding said chip carriers in a chip carrier pallet includes providing a matrix of chambers open at the top side and bottom side of said pallet, said pallet having a protective barrier that protects the chip carrier in a recessed position when the chip carriers are positioned in a chambers.

15. The method of claim 14 including the step of securing and positioning said chip carriers during said stenciling process with a print fixture pedestal having a matrix like array of protrusions, each protrusion being positioned and sized to fit into the bottom of a chamber in said pallet and engage securely but detachably the bottom side of a chip carrier in said chamber and thereby lift said chip carrier above said protective barrir during said stenciling process, assure said chip carrier will disengage from said stenciling process when completed and return said chip carriers to said recessed position.

16. The method of claim 15 wherein said step of securing said chip carrier comprises said protrusion securing said bottom side of said chip carrier by a vacuum created by an aperture at the top of said protrusion surface which abuts against the bottom side of said chip carrier.

* * * * *

UNITED STATES PATENT AND TRADEMARK OFFICE
CERTIFICATE OF CORRECTION

PATENT NO.         : 7,103,970 B2                                    Page 1 of 1
APPLICATION NO. : 10/098269
DATED                 : September 12, 2006
INVENTOR(S)       : Kenneth J. Kledzik It is certified that error appears in the above-identified patent and that said Letters Patent is hereby corrected as shown below:

Claim 3, column 7, line 34, "recieving" should read --receiving--;

Claim 3, column 7, line 44, "carries" should read --carriers--;

Claim 7, column, 8, line 12, "recieving" should read --receiving--;

Claim 11, column 8, line 39, "preparing" should read --prepasting--;

Claim 11, column 8, line 40, "depostiing" should read --depositing--;

Claim 12, column 8, line 44, "recieving" should read --receiving--; and

Claim 15, column 10, line 2, "barrir" should read --barrier--.

Signed and Sealed this

Twenty-seventh Day of February, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,103,970 B2 |
| APPLICATION NO. | : 10/098269 |
| DATED | : September 12, 2006 |
| INVENTOR(S) | : Kenneth J. Kledzik |

It is certified that error appears in the above-identified patent and that said Letters Patent is hereby corrected as shown below:

Title Page,
Item 75, inventors: "Kenneth J. Kledzik, San Clemente, CA (US)" should read
--Kenneth J. Kledzik; Jason C. Engle, both of San Clemente, CA (US)--.

Signed and Sealed this

Fourteenth Day of October, 2008

JON W. DUDAS
*Director of the United States Patent and Trademark Office*